(12) United States Patent
De Bokx et al.

(10) Patent No.: US 7,106,412 B2
(45) Date of Patent: Sep. 12, 2006

(54) LITHOGRAPHIC APPARATUS COMPRISING A GAS FLUSHING SYSTEM

(75) Inventors: Pieter Klaas De Bokx, Eindhoven (NL); Tjarko Adriaan Rudolf Van Empel, Eindhoven (NL); Ronald Johannes Hultermans, Utrecht (NL); Adrianus Cornelius Antonius Jonkers, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 96 days.

(21) Appl. No.: 10/776,641

(22) Filed: Feb. 12, 2004

(65) Prior Publication Data

US 2004/0212791 A1    Oct. 28, 2004

(30) Foreign Application Priority Data

Feb. 12, 2003    (EP) .................................. 03075416

(51) Int. Cl.
    *G03B 27/52*    (2006.01)
    *G03B 27/42*    (2006.01)

(52) U.S. Cl. .......................................... 355/30; 355/53

(58) Field of Classification Search ................ 355/30, 355/53, 67–71; 250/548
    See application file for complete search history.

(56) References Cited

U.S. PATENT DOCUMENTS 4,801,352 A * 1/1989 Piwczyk .................. 156/345.5

| | | | |
|---|---|---|---|
| 6,555,834 B1 * | 4/2003 | Loopstra .................. | 250/492.3 |
| 6,721,031 B1 * | 4/2004 | Hasegawa et al. ............ | 355/30 |
| 6,933,513 B1 * | 8/2005 | Van Empel et al. ..... | 250/492.3 |
| 6,954,255 B1 * | 10/2005 | Hasegawa et al. ............ | 355/30 |
| 2002/0139247 A1 | 10/2002 | Alvarez, Jr. et al. .......... | 95/116 |
| 2002/0191163 A1 | 12/2002 | Hasegawa et al. ............ | 355/30 |

FOREIGN PATENT DOCUMENTS

EP    1 229 573 A1    8/2002

* cited by examiner

*Primary Examiner*—Henry Hung Nguyen
(74) *Attorney, Agent, or Firm*—Pillsbury Winthrop Shaw Pittman, LLP

(57) ABSTRACT

A lithographic projection apparatus includes a radiation system constructed and arranged to supply a projection beam of radiation, a support structure constructed and arranged to support a patterning structure, the patterning structure constructed and arranged to pattern the projection beam according to a desired pattern, a substrate support constructed and arranged to support a substrate, and a projection system constructed and arranged to project the patterned beam onto a target portion of the substrate. The apparatus further includes a gas flushing system comprising radial gas flow outlets, said gas flushing system being constructed and arranged to generate a radial gas flow through said radial gas flow outlets in an intermediate space defined between said gas flushing system and said substrate, wherein the radial gas flow has a radial velocity directed outwards in said space with a magnitude larger than zero at every location in said space.

30 Claims, 3 Drawing Sheets

LITHOGRAPHIC APPARATUS COMPRISING A GAS FLUSHING SYSTEM

This application claims priority from European Patent Application No. 03075416.2, filed Feb. 12, 2003, herein incorporated by reference in its entirety.

BACKGROUND OF THE INVENTION

1. Field of the Invention

This invention relates to a lithographic projection apparatus and more particularly to a lithographic projection apparatus including a gas flushing system.

2. Description of Related Art

The term "patterning structure" used herein should be broadly interpreted as referring to structure that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described hereabove, the patterning structure can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

To reduce the size of features that can be imaged in lithographic projection apparatus, it is desirable to reduce the wavelength of the illumination radiation. To such end, it has been proposed to use wavelengths of less than about 200 nm, for example 157 nm or 126 nm. However, such wavelengths are strongly absorbed by normal atmospheric air leading to unacceptable loss of intensity as the beam traverses the apparatus. To enclose the entire apparatus and operate in vacuum would introduce unacceptable delays in wafer and reticle exchange, whereas to flush the entire apparatus with a gas which does not absorb the illumination wavelength, such as ultra-pure nitrogen ($N_2$), would result in excessive operating costs due to the consumption of the gas in an imperfectly closed machine.

EP 1098226 describes a system wherein laminar flows are provided by a flushing system comprising a supply and a vacuum pump, and wherein the laminar flows are parallel to, e.g., a thin sheet and the mask in the mask stage, or parallel to a last lens and the substrate in the wafer stage. In EP 1098226, a kind of "purge hood" is mounted on the projection system PL on the side facing the substrate, surrounding the last element of the projection system, and creating a volume between the projection system and the substrate, with walls having an inlet for the flushing gas and an outlet. The flow, however, has to be rather fast in order to prevent the introduction of air/gas from outside of the "hood". Also, at the outlet, gas from outside of the "hood" may be drawn. Furthermore, the gas introduced inside the hood may leak to the outside and change the gas composition outside the hood. Sensors, e.g., for determining the position or height of the wafer, etc, for example based on transmission or index of refraction of the gas, may in this way be disturbed, which will lead to less reproducible results.

In addition, photo-resist polymers are known to take up rather large amounts of water (several vol. %) from ambient air, and this water absorbs part of the incident light, especially light with short wavelengths like 157 or 126 nm. The amount of water remaining during illumination may well lead to a much larger transmission loss than that caused by water in the vapour phase. The total amounts of water absorbed by photo-resist polymers at equilibrium with a 50% RH (relative humidity) gas atmosphere at 22° C. are generally between about 1.0 vol. % and 2.5 vol. %. EP 1098226 neither discloses how to dry a resist on the wafer and remove water before the projection beam reaches the resist on the wafer, nor suggests that this is necessary. The laminar flow may only remove water that is present in the gas phase.

SUMMARY

Hence, it is an aspect of the present invention to provide a system that reduces absorption of the projection beam light by water, e.g. on the resist. Another aspect of the invention is to remove part of the water from the resist before the projection beam reaches the surface of the resist on the substrate, and therefore to increase the transmission of the resist.

According to an aspect of the present invention, there is provided a lithographic projection apparatus including:
  a radiation system constructed and arranged to supply a projection beam of radiation;
  a support structure constructed and arranged to support a patterning structure, the patterning structure constructed and arranged to pattern the projection beam according to a desired pattern;
  a substrate support constructed and arranged to support a substrate;
  a projection system constructed and arranged to project the patterned beam onto a target portion of the substrate; and
  a gas flushing system comprising radial gas flow outlets, said gas flushing system being constructed and arranged to generate a radial gas flow through said radial gas flow outlets in an intermediate space defined between said gas flushing system and said substrate, wherein said radial gas flow has a radial velocity directed outwards in said space with a magnitude larger than zero at every location in said space.

The radial gas flow dries or removes part of the water adsorbed on and present in the resist, before the projection beam reaches the resist. This advantageously reduces absorption of the projection beam light by water. In this way, the transmission loss is minimized, and the differences in transmission are also minimized. The atmosphere between the last lens of the projection system and the substrate, and between the gas flushing system and substrate, may now be better controlled. In an embodiment of the present invention, the radial gas flow, at least in the direction of movement of the substrate table (or support stable), has a velocity equal or higher than the instantaneous velocity of the substrate table (or substrate table).

In an embodiment of the present invention, the gas flushing system further comprises outlets (or outlet ports) and inlets (or inlet ports) that are constructed and arranged to generate a substantially laminar gas flow across at least part of said projection beam between a last lens of the projection system and said substrate. In this way, when using such a lithographic apparatus, absorption of the projection beam is minimized while avoiding detrimental effects on the throughput and maintenance overhead of the apparatus, as well as reducing the use of expensive consumables. The laminar flow across the last lens of the projection system also decreases the possibility of deposition of organic compounds on the surface of the last lens, e.g. from the resist.

The laminar gas flow, generated between the outlets (or outlet ports) and inlets (or inlet ports) across at least part of the projection beam between a last lens of the projection system and substrate, includes, in an embodiment of the invention, a flushing gas that is substantially non-absorbent to said radiation of said projection system. This flushing gas may include e.g., one or more gases selected from the group consisting of (ultra pure) $N_2$, He, Ar, Kr, and Ne. The gas, which is used for the radial gas flow and which is generated in the volume between the substrate and the gas flushing system, may comprise, in an embodiment of the invention, a gas having a composition different from that of said gas of the laminar gas flow. This may be so because the requirements are different for these gases. In an embodiment of the invention, the radial gas flow includes a gas that has a water contamination of less than 1 ppm, more preferably less than 0.01 ppm, and even more preferably less than about 0.001 ppm.

According to a further embodiment of the present invention, the gas flushing system further includes extra exhaust inlets (or radial gas flow exhaust inlets) which are located to the outside, with respect to the outlets (or radial gas flow outlets), of said gas flushing system which provide the radial gas flow, and which are arranged to exhaust part or a substantial part of the gas radial gas flow, which is directed outwards in said space. This also leads to a better-controlled atmosphere outside of the region between the last lens of the projection system and the substrate and thus to a better controlled transmissions and indices of refraction. This is advantageous, since, e.g., sensors that determine the height of the substrate or the position can be very sensitive to slight differences in transmission and/or indices of refraction.

In another embodiment of the present invention, the last lens of the projection system may be included in a lower lens element formed of a material substantially transparent to the radiation, and wherein a cover member is substantially planar and is provided substantially parallel to the direction of said laminar flow. Such a component can be provided to cover a non-planar surface of a component, e.g. the last lens, of the lithographic apparatus in or adjacent to said part of said beam path.

According to a further aspect of the invention, there is provided a method of manufacturing a device including:
  providing a beam of radiation;
  patterning the beam of radiation;
  projecting the patterned beam of radiation onto a target portion of a layer of radiation-sensitive material provided on a substrate; and
  flowing a radial flushing gas from a radial gas flow outlet toward an outer part of said substrate in an intermediate space between a gas flushing system and said substrate.

Hence, this invention provides a method and apparatus to reduce water on and in the resist, before the resist is exposed to the radiation, and also a method to reduce the transmission losses as a result of water present in and on the resist.

In a further aspect of the invention, there is provided a method wherein part of the radial gas flow, which is directed outward, is exhausted by exhaust inlets (or radial gas flow exhaust inlets) located on the outside, with respect to the outlets (or radial gas flow outlets), of the gas flushing system of the lithographic projection apparatus.

In another embodiment of the present invention, the lithographic apparatus used in this method further includes outlets (or outlet ports) and inlets (or inlet ports) constructed and arranged to generate a substantially laminar gas flow across at least part of said projection beam between a last lens of the projection system and said substrate.

According to another aspect of the invention, there is provided a device which is manufactured according to the method of the present invention or with the apparatus according to the present invention.

According to yet another aspect of the invention, there is provided a lithographic projection apparatus including:
  a radiation system constructed and arranged to supply a projection beam of radiation;
  a support structure constructed and arranged to support a patterning structure, the patterning structure constructed and arranged to pattern the projection beam according to a desired pattern;
  a substrate support constructed and arranged to support a substrate;
  a projection system constructed and arranged to project the patterned beam onto a target portion of the substrate; and
  a gas flushing system that creates a laminar flow in a first direction across said substrate, and further creates a secondary flow having portions thereof travelling in at least one direction substantially different from said first direction, said secondary flow being generally below said laminar flow.

According to another aspect of the invention, there is provided a lithographic projection apparatus including:
  a radiation system constructed and arranged to supply a projection beam of radiation;
  a support structure constructed and arranged to support a patterning structure, the patterning structure constructed and arranged to pattern the projection beam according to a desired pattern;
  a substrate support constructed and arranged to support a substrate;
  a projection system constructed and arranged to project the patterned beam onto a target portion of the substrate; and
  a gas flushing system that includes a first outlet that generates a laminar flow in a first direction, generally parallel to an upper surface of said substrate, and a second outlet that directs gas in a direction generally perpendicular to said laminar flow, towards said substrate.

Although specific reference may be made in this text to the use of the apparatus according to the invention in the manufacture of ICs, it should be understood that such an apparatus may have many other possible applications. For example, it may be employed in the manufacture of integrated optical systems, guidance and detection patterns for magnetic domain memories, liquid-crystal display panels, thin-film magnetic heads, etc. It should be understood that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm or, when applicable, even shorter wavelengths), but especially radiation which has a wavelength less than 200 nm, more preferably about 157+/−5 nm or about 126+/−5 nm. The term "a laminar gas flow" used herein should be interpreted as referring to a gas flow that is substantially laminar.

The term "gas composition" used herein refers to pure gases or gas compositions. The term "lower lens element" used herein refers to a last lens of the projection system before the projection beam reaches the substrate, which is usually mounted on a lens mount, e.g. of steel.

The term "outlet" as used herein can also be considered or termed as an outlet port. Similarly, the term "inlet" as used herein can also be considered or termed as an inlet port. It should be understood that the terms outlet, outlet port, inlet and inlet port broadly refer to a structure through which a gas or substance is flown.

The term "substrate table" as used herein can also be considered or termed as substrate support. It should be understood that the term substrate table broadly refers to a structure that is configured to support a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
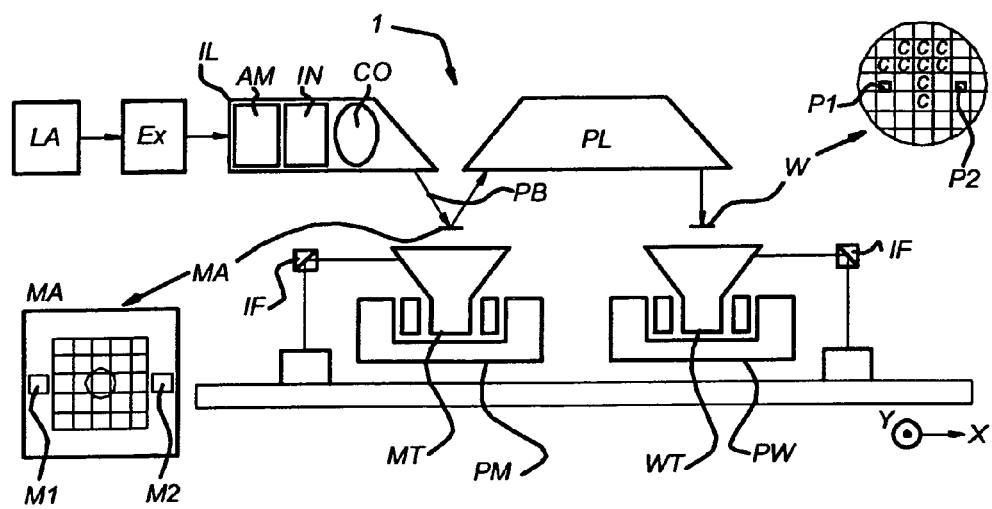
FIG. 1 depicts a lithographic projection apparatus according to an embodiment of the invention.

FIG. 1 schematically depicts a lithographic projection apparatus 1 according to a particular embodiment of the invention. The apparatus includes:

a radiation system including a radiation source LA, a beam expander Ex, and an illumination system IL, configured to supply a projection beam PB of radiation (e.g. 157 nm radiation);

a first object table (mask table) MT provided with a mask holder and configured to hold a mask MA (e.g. a reticle), and connected to first positioning device PM that is configured to accurately position the mask with respect to item PL;

a second object table (substrate table or substrate support) WT provided with a substrate holder and configured to hold a substrate W (e.g. a resist-coated silicon wafer), and connected to second positioning device PW that is configured to accurately position the substrate with respect to item PL; and a projection system ("lens") PL (e.g. refractive, catadioptric or reflective optics) constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning structure, such as a programmable mirror array of a type as referred to above.

The source LA (e.g. a 157 or a 126 nm laser source) produces a beam of radiation. This beam is fed into an illumination system (illuminator) IL, either directly or after having traversed conditioning devices, such as a beam expander Ex, for example. The illuminator IL may comprise adjusting device AM configured to set the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is a laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring means IF), the substrate table (or substrate support) WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realised with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
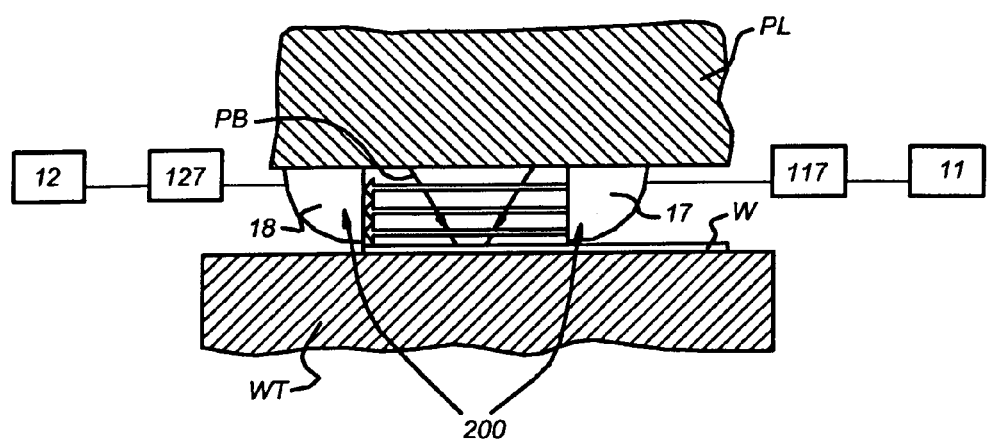
FIG. 2 is an enlarged view of the wafer stage of the embodiment of FIG. 1 with a gas flushing system.

FIG. 2 shows the wafer stage of the lithographic apparatus of FIG. 1, including a flushing system 200 constructed and arranged to generate a flow across part of the projection beam according to the state of the art (e.g. EP 1098226). In the wafer stage there is only a single space to be flushed between a last (lens) element of the projection lens system PL and wafer or substrate W. To avoid providing a flushing gas path covering the entire range of movement of the wafer stage, the flushing system 200 comprises flushing gas supply outlets (or outlet ports) 17 and evacuation inlets (or inlet ports) 18, which are mounted on a last (lens) element of the projection lens system PL, at either side of the final element. They can also be positioned next to or around the final lens element. By providing outlets (or outlet ports) 17 and evacuation inlets (or inlet ports) 18, a laminar or substantially laminar gas flow can be provided and maintained.

Outlets (or outlet ports) 17 and inlets (or inlet ports) 18 are respectively connected to a flushing gas supply 11 and a reservoir 12 via flow regulator 117 and vacuum pump 127, respectively. The outlets (or outlet ports) 17 in particular, but also the inlets (or inlet ports) 18, may be provided with vanes to guide the flow of flushing gas. Outlets (or outlet ports) 17 and inlets (or inlet ports) 18 can be interpreted as the above-mentioned "hood", or also called "purge hood", forming together with the lens and the substrate W a certain volume.

In case that the final element of the projection lens system PL is not flat, it may be covered with a thin sheet, as shown below.

The flow regulator 117 mentioned above may include static or controllable pressure or flow reducers and/or blowers in order to provide the desirable gas flow rates for the particular embodiment and the available gas supply. This also applies for other flow regulators mentioned herein (see below, 137). Vacuum pump 127, or other vacuum pumps mentioned below, may also include other devices constructed and arranged to exhaust part of the gas(ses).

Figure 3:
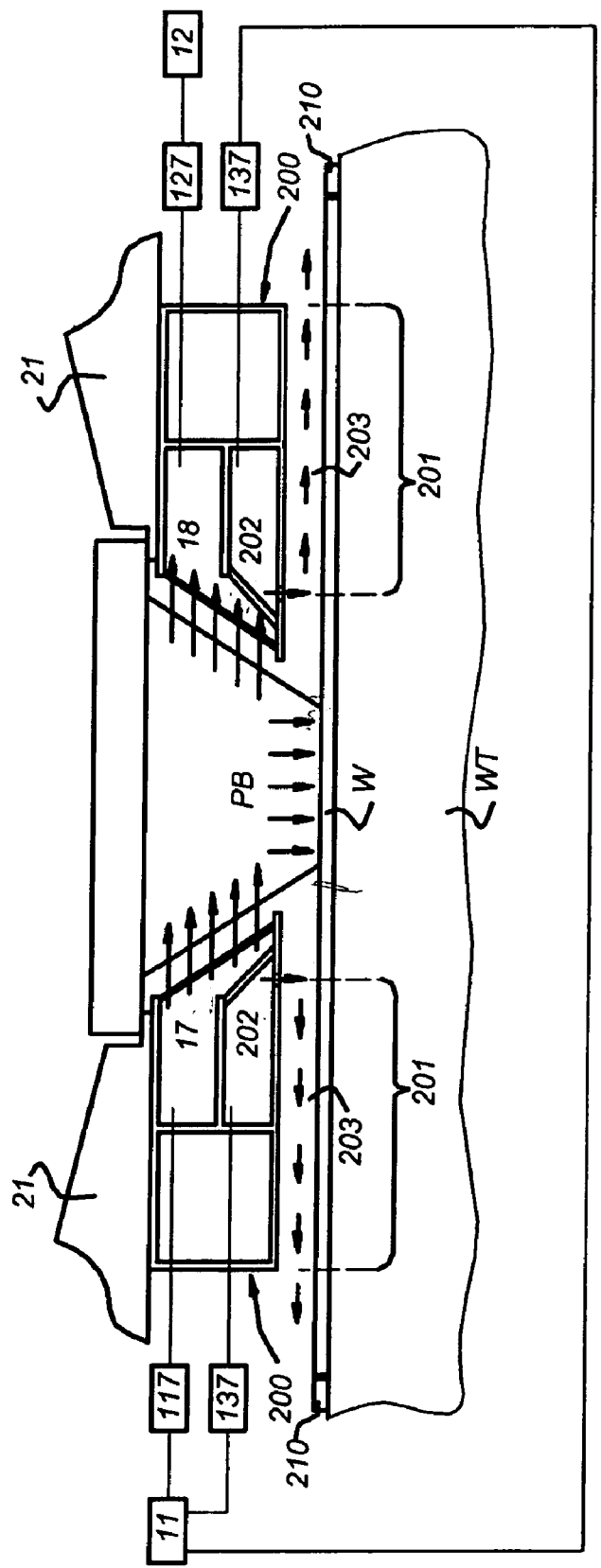
FIG. 3 is a schematic drawing of the gas flushing system according to an embodiment of the invention.

In FIG. 3, a schematic drawing of the gas flushing system according to an embodiment of the present invention is shown. It shows the wafer stage of the lithographic apparatus, including a flushing system 200 with flushing gas supply outlets 17 (or first outlet) and evacuation inlets (or inlet ports) 18, which are mounted on a last (lens) element 21 of the projection lens system PL, on either side of the last element.

As can be seen in FIG. 3, the system 200 includes a first outlet 17 that generates a laminar flow in a first direction, generally parallel to the upper surface of the substrate, and a second outlet 202 that directs gas in a direction generally perpendicular to the laminar flow towards the substrate. The gas emitted from the second outlet 202 has at least a portion thereof then directed in a direction that is different from the direction of the laminar flow (e.g., see left hand side of FIG. 3).

The spaces traversed by the projection beam PB are flushed with a laminar flow of (ultra-pure) nitrogen ($N_2$), or other gas (e.g. Helium, Argon or Xenon) transparent to the illumination radiation used. In an embodiment of the present invention, to ensure laminar flow between 17 and 18 and minimize turbulence, all parts may be smoothed, as far as possible. The effective Reynolds number of the system is thereby reduced. Due to the minimization of turbulence vortices, contamination of the flushing gas is minimized and the gas may be recovered and re-used (e.g. by unit 12). Re-use of the gas may be in the same area from which it was recovered or may be elsewhere, e.g. in a cascade fashion. In such an arrangement, fresh flushing gas is supplied to the most critical area(s) and may then re-used in successively less critical areas. The flushing gas may be cleaned or scrubbed before re-use and mixed with fresh gas as desired to control contamination levels.

EP 1098226, which is herein incorporated by reference, describes that ultra-pure nitrogen ($N_2$), used as flushing gas, has an extinction coefficient, k, at 1 standard atmosphere that is less than about 0.0001 per cm traversed. In comparison, the extinction coefficient k of air at 1 standard atmosphere is approximately 46 per cm traversed. The actual gas pressure in the beam path may be above atmospheric pressure, in an embodiment of the present invention. Flushing nitrogen, or another relevant flushing gas, may be provided at high purity, i.e. with an air and/or water contamination of less than 1 ppm, preferably less than 0.1 ppm, more preferably less than 0.01 ppm, and even more preferably less than 0.001 ppm. Preferably, the contamination with air is less than 5 ppm, more preferably less than 1 ppm, and even more preferably less than 0.1 ppm.

To ensure laminar flow, the last lens element 21 may comprise e.g. a sheet or pellicle of a material substantially transmissive to the employed radiation, such as $CaF_2$, $MgF_2$, $BaF_2$, fused $SiO_2$, or any other material that can form a sheet or pellicle which has a high transmission for the wavelength of the radiation used in the lithographic apparatus. Polymer pellicles are preferably avoided to avoid diffusion across them. In some embodiments of the invention, the pellicle may be omitted altogether, in which case the flushing gas supply is simplified. The flushing gas supply system 200, which is mounted on, or around, last lens mount 21, is also called "purge hood".

In the embodiment of the invention shown in FIG. 3, the purge hood has a lower surface that is substantially parallel to the wafer (and covers a part of the upper surface of the wafer). This surface, however, can also be bended and/or have an angle with respect to the wafer. In an embodiment of the invention, the gas supply system 200 will have a lower surface which is substantially parallel to the wafer.

Gas flushing system 200 further includes, according to the embodiment of the invention shown in FIG. 3, extra outlets 202 (or extra radial gas flow outlets 202), which are connected to the flushing gas supply 11 via a flow regulator 137. For the sake of understanding, outlets 202 and flow regulators 137 are drawn on both sides of the projection beam. However, it should be understood that the drawing to this respect is symmetric, and that the outlets 202 (or radial gas flow outlets 202) may be located all around the beam. Therefore, it should be understood that only one flow regulator 137 may be necessary. It should also be understood that, in an embodiment of the present invention, the outlets 202 may belong to different compartments, which each have there own flow regulator 137. In this way, an even better controlled externally directed radial gas flow 203 can be generated.

In FIG. 3, the gas flow 203 (or radial flushing gas 203) is directed from the radial gas flow outlets toward an outer part of the substrate in the intermediate space between the gas flushing system and the substrate. Thus, between the purge hood and the wafer, gas flow 203 created by the gas coming from the outlets 202 travels along a certain length 201, which is defined as the length between the outlet 202 at the projection beam side and the outer side of the gas flushing system 200 (see also FIG. 3); in other words it is the width of the space between the purge hood and substrate W.

As can be seen in the embodiment of the invention shown in FIG. 3, the system 200 creates a laminar flow in a first direction across the substrate, and further creates a secondary flow having portions thereof travelling in at least one direction substantially different from said first direction. In this embodiment, the secondary flow is generally below the laminar flow.

The speed of the externally directed gas flow 203 can be regulated by flow regulator 137, but this speed is also a function of the speed and pressure of the gas flow between 17 and 18, which can be regulated by flow regulators 117 and vacuum pump 127. The laminar and radial gas flows are adjusted in such a way that, at the used substrate table (or substrate support) velocity, the velocity of the radial gas flow 203, at every location in the space between the gas flushing system and the substrate is higher than zero and directed outwards. The radial gas flow velocity is the vectorial sum of gas flow speed created at the outlets 202 and the substrate table velocity. The term "substrate table velocity" includes, e.g. the substrate table (or substrate support) scanning velocity of a step-and-scan type lithographic projection apparatus, as well as, in the case of a step-and-repeat type lithographic projection apparatus, the velocity of the wafer table between subsequent exposures. When the requirement of radial gas flow with a velocity higher than zero and directed outwards is fulfilled, dry gas is provided above the resist, thereby reducing the amount of water on and in the resist. This leads to the above-mentioned advantages like reduction of transmission loss. It may be desirable that the radial gas flow has a velocity substantially higher than zero at every location in space, e.g. equal or preferably higher than the substrate table velocity, and preferably at least in the direction of movement of the substrate table (or substrate support).

In the embodiment of the invention shown in FIG. 3, the gas from the surroundings of the gas flushing system 200 will not substantially enter the area under the purge hood. It is possible however that some diffusion and turbulence cause some gas from the surroundings to enter the volume under the purge hood. In order to reduce this phenomenon, it may be desirable to increase the gas speed. Thus, when the gas speed is high enough, this gas will substantially not enter the volume of the projection beam PB between 17, 18 and the substrate W.

The amount of water in the resist depends on the resist layer thickness. Assuming a 157 nm lithography and a resist layer thickness of approximately 200 nm or less, it appears that drying the resist by the radial gas flow 203 with a purge gas $N_2$, He, Xe etc. leads to a reduction of transmission loss of about 10% to about 1% in a period of less than about 0.01 s. The transmission loss left (about 1%) is due to remnant water, which is more strongly bound in the resist. Preferably, the gas that is supplied, has a water contamination of less than about 1 ppm, preferably less than about 0.01 ppm, and more preferably less than about 0.001 ppm.

This means that length 201 should be about 0.01 s times the (average) substrate table velocity. Taking for example a substrate table velocity of about 0.3 m/s, this means that a length 201 of about 3 mm may be enough. Preferably, the length 201 is at least about 5 mm, more preferably at least about 10 mm, and most preferably at least about 20 mm. It should be understood that this calculated length 201 (i.e. substantially the width of the space between the purge hood and substrate W (i.e. resist on substrate W)), depends upon the water amount in the resist, which on its turn is a function of the resist thickness, and also depends on the substrate table speed. The values given here are especially applicable for resists known in the art for these applications, with a resist thickness of about 200 nm. It should be understood, however, that it is possible to obtain optimal results for other process conditions by appropriately selecting the wavelength, resist, resist thickness, substrate table speed. The lengths given here, especially apply for a lithographic apparatus using radiation of 157 nm, and above mentioned resist thickness.

By using such a length 201, i.e. such a drying length, a substantial part of water, mainly loosely bound water, present in and on the resist, is removed and transported to the regions outside of the purge hood (gas flushing system 200). Hence, transmission differences are minimized. In a lithographic apparatus without the gas flushing system of the invention, transmission losses were about 10%. Now, the transmission losses, when using the apparatus of the invention, is about 1% or less, preferably less than 0.1%. In this way, more reproducible results, i.e. better IC's, may be obtained, and e.g. sensors to determine the substrate height may be hindered less by differences in transmission or indices of refraction.

In FIG. 3, outlets 202 (or radial gas flow outlets 202) are connected to flushing gas supply 11. In an embodiment of the invention, the gas supply 11 contains different gas supplies. In this way, radial gas flow 203 from outlets 202 may include a gas having a composition different from said gas of the laminar gas flow. Since the requirements for the gas flow 203 (e.g. gas able to dry resist), and the laminar flow between 17 and 18 (at least transparent for the projection beam PB), may be different, the composition of these gasses can be different. Then, different gas supplies 11 may be desirable.

Next to the substrate W, elevations 210 may be present to make the surface under the projection beam and "purge hood" (more) flat. In an embodiment of the present invention, these elevations 210 have the same height as substrate W, with a possible difference in height of preferably less than 0.5 mm, more preferably less than 0.1 mm, even more preferably 0.01 mm or less. The same applies for the splits or fissures between the substrate W and the elevation(s) 210. The width of this split is preferably less than 0.5 mm, more preferably less than 0.1 mm, even more preferably 0.01 mm or less. The elevation(s) 210 can be again one elevation or a number of elevations, e.g. all around substrate W. It can also comprise sensors, e.g. sensors to determine the speed, height etc. In this way, substrate table (or substrate support) WT can have a square or rectangular shape with a saving for the substrate, and wherein the substrate is surrounded by an elevation 210, or a number of elevations 210. In these elevations 210, sensors can be present, having the same height as the elevation (these sensor might be covered if necessary to obtain a flat surface with substantially the same height as elevation 210). By reducing the widths of the slits and the differences in height, a flat surface is obtained, which is beneficial for the radial gas flow 203 and for reducing possible turbulences.

Figure 4:
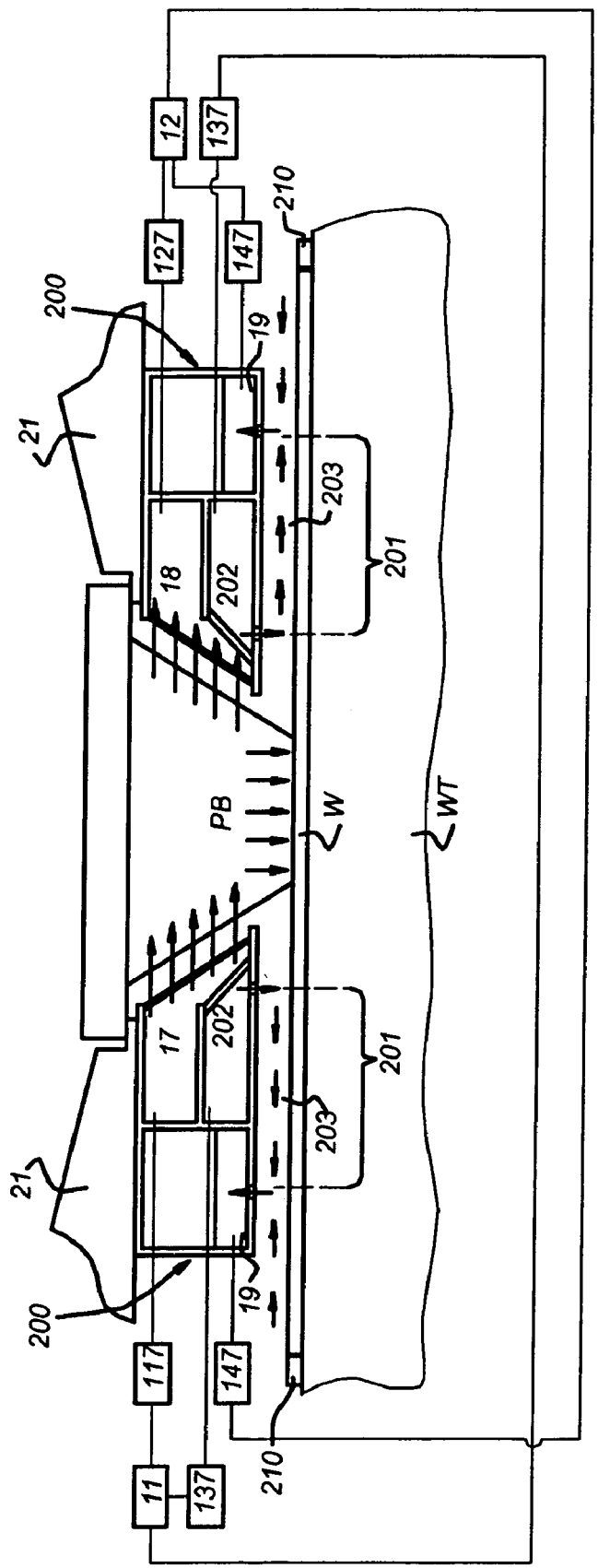
FIG. 4 is a schematic drawing of a gas flushing system of the invention according to another embodiment of the invention.

FIG. 4 depicts another embodiment of the present invention. In this embodiment of the invention, the gas flushing system 200 further includes exhaust inlets (or radial gas flow exhaust inlets) 19, located at the outside of the purge hood (i.e. at the outer side of the gas flushing system), with respect to the outlets 202, of said gas flushing system 200, arranged to exhaust part of the radial gas flow 203. In this way, part, or a substantial part of the radial gas flow 203 is exhausted by exhaust inlets (or radial gas flow exhaust inlets) 19.

The exhausts 19 are shown in the schematic drawing as separate exhausts, but they are meant to be a series of exhausts, all around the outlets 202, which are on their turn all around or substantially around the lens or last lens element 21 of the projection system PL. The exhausts 19 are connected to a vacuum pump 147, which can be a number of vacuum pumps (or exhaust devices) in an embodiment of the present invention. Vacuum pump 147 may be connected to reservoir 12, and in case different gas compositions are used for the volume where the projection beam PB is found and for the volume below the gas flushing system 200, they may be connected to a number of reservoirs 12. The exhausts 19 need not necessarily be connected to the purge hood, i.e. be part of the gas flushing system 200.

In the embodiment of the invention shown in FIG. 4, length 201 is defined as the length (or width) between outlet 202 at the projection beam side and inlet 19. Preferably, the length 201 is at least about 5 mm, more preferably at least about 10 mm, and most preferably at least about 20 mm.

In this way, purge gas, that may have different characteristics, like the index of refraction, than the gas or gas mixture outside of the purge hood, does not substantially escape to the outside. Hence, more reproducible results, i.e. better IC's, are obtained, since, e.g., sensors configured to determine the substrate height, speed or position, which are placed outside of the volume between the last lens element and the substrate, may be hindered less by the differences in transmission or indices of refraction of the gas(ses).

In an embodiment of the invention, aerodynamic features such as small strips or fins may be provided in any of the spaces, as desired to smooth or guide the flushing gas flow and eliminate or control vortex production.

In another embodiment of the invention, the gas flushing system of the invention and the related parts like regulators, vacuum pumps, reservoirs etc, may further include flow restrictors, blowers, flow control members, e.g. provided in said part of said beam path to direct said laminar flow or reduce turbulence therein, etc. It may also include sensors to measure e.g. gas flow velocities or gas compositions, etc.

While specific embodiments of the invention have been described above, it will be appreciated that the invention may be practised otherwise than as described. The description of the embodiments and the figures are not intended to limit the invention. For example, the embodiments and figures include a gas flushing system constructed and arranged to create a laminar flow, but according to the invention, such laminar flow is a feature that is preferable, but its presence is not necessary to obtain the advantages of the present invention.

What is claimed is:

1. A lithographic projection apparatus comprising:
   a support structure constructed and arranged to support a patterning structure, the patterning structure constructed and arranged to pattern a beam of radiation according to a desired pattern;
   a substrate support constructed and arranged to support a substrate;
   a projection system constructed and arranged to project the patterned beam of radiation onto a target portion of the substrate; and
   a gas flushing system comprising a radial gas flow outlet arranged proximate an inner side of the gas flushing system that is adjacent a path of said patterned beam of radiation, said gas flushing system constructed and arranged to generate a radial gas flow through said radial gas flow outlet in an intermediate space defined between said gas flushing system and said substrate,
   wherein said radial gas flow has a radial velocity directed outwards in said space with a magnitude greater than zero at every location in said space.

2. An apparatus according to claim 1, wherein said gas flushing system further comprises an outlet port and an inlet port that are constructed and arranged to generate a substantially laminar gas flow across at least part of said beam of radiation between a last lens of the projection system and said substrate.

3. An apparatus according to claim 1, wherein a length of said intermediate space between said radial gas flow outlet and an outer side of said flushing system is at least about 5 mm.

4. An apparatus according to claim 1, wherein said gas flushing system further comprises a radial gas flow exhaust inlet, located between said radial gas flow outlet and an outer side of said gas flushing system, said radial gas flow exhaust inlet constructed and arranged to exhaust part of the radial gas flow.

5. An apparatus according to claim 4, wherein a length of said intermediate space between said radial gas flow outlet and said radial gas flow exhaust inlet is at least about 5 mm.

6. An apparatus according to claim 3, wherein said length is at least about 10 mm.

7. An apparatus according to claim 6, wherein said length is at least about 20 mm.

8. An apparatus according to claim 2, wherein said substantially laminar gas flow, generated between said outlet port and said inlet port across at least part of said beam of radiation between a last lens of the projection system and said substrate, comprises a flushing gas that is substantially non-absorbent to said radiation of said projection system.

9. An apparatus according to claim 8, wherein said flushing gas comprises one or more gases selected from the group consisting of $N_2$, He, Ar, Kr, and Ne.

10. An apparatus according to claim 8, wherein said flushing gas in said part of said beam has a contamination of air of less than about 5 ppm.

11. An apparatus according to claim 10, wherein said flushing gas in said part of said beam has a contamination of air of less than about 1 ppm.

12. An apparatus according to claim 11, wherein said flushing gas in said part of said beam path has a contamination of air of less than about 0.1 ppm.

13. An apparatus according to claim 8, wherein said flushing gas has an extinction coefficient less than about 0.005 per cm.

14. An apparatus according to claim 13, wherein said flushing gas has an extinction coefficient less than about 0.001 per cm.

15. An apparatus according to claim 1, wherein said radial gas flow comprises a gas that has a water contamination of less than about 1 ppm.

16. An apparatus according to claim 15, wherein said radial gas flow comprises a gas that has a water contamination of less than about 0.01 ppm.

17. An apparatus according to claim 16, wherein said radial gas flow comprises a gas that has a water contamination of less than about 0.001 ppm.

18. An apparatus according to claim 2, further comprising a lower lens element formed of a material substantially transparent to said radiation, and a cover member that is substantially planar and provided substantially parallel to the direction of said laminar flow to cover a non-planar surface of a component of said lithographic apparatus in or adjacent to said part of said beam.

19. An apparatus according to claim 18, wherein said material substantially transparent to said radiation is selected from the group consisting of $CaF_2$, $SiO_2$, $MgF_2$ and $BaF_2$.

20. An apparatus according to claim 1, wherein said radiation of said beam of radiation has a wavelength less than about 200 nm.

21. An apparatus according to claim 1, wherein said radiation of said beam of radiation has a wavelength selected from the group consisting of: between about 152 nm and about 162 nm and between about 121 nm and about 131 nm.

22. An apparatus according to claim 2, wherein said radial gas flow comprises a gas having a composition different from that of the gas of said laminar gas flow.

23. A method of manufacturing a device comprising:
   patterning a beam of radiation;
   projecting the patterned beam of radiation onto a target portion of a layer of radiation-sensitive material provided on a substrate; and
   flowing a radial flushing gas with a gas flushing system from a radial gas flow outlet arranged proximate an inner side of the gas flushing system that is adjacent a path of said beam of radiation toward an outer part of said substrate in an intermediate space between the gas flushing system and said substrate.

24. A method according to claim 23, wherein flowing a radial flushing gas comprises flowing a radial flushing gas with a velocity having a magnitude larger than zero at every location in said space.

25. A method according to claim 23, further comprising flowing a flushing gas in a substantially laminar flow across at least part of said beam of radiation between a last lens of a projection system that projects the patterned beam of radiation and said substrate.

26. A method according to claim 23, further comprising exhausting part of said radial flushing gas through a radial gas flow exhaust inlet, said inlet being arranged in said flushing system and in communication with said intermediate space.

27. An apparatus according to claim 1, wherein said substrate support is constructed and arranged to move said substrate with respect to said projection system, and wherein the radial gas flow has a velocity equal to or higher than an instantaneous velocity of the substrate support at least in the direction of movement of the substrate support.

28. An apparatus according to claim 1, wherein the intermediate space is defined between a lower surface of the gas flushing system and the substrate, said lower surface covering a part of an upper face of said substrate on which a radiation-sensitive material is disposed.

29. An apparatus according to claim 28, wherein said lower surface is substantially parallel to the upper face of said substrate.

30. An apparatus according to claim 1, wherein the gas flushing system further comprises a supply of flushing gas and a gas flow regulator that are in communication with the radial gas flow outlet.

* * * * *